United States Patent [19]

Dubetsky

[11] 4,259,061
[45] Mar. 31, 1981

[54] METHOD OF ACHIEVING UNIFORM SINTERING SHRINKAGE IN A LAMINATED PLANAR GREEN CERAMIC SUBSTRATE AND APPARATUS THEREFOR

[75] Inventor: Derry J. Dubetsky, Wappingers Falls, N.Y.

[73] Assignee: International Business Machines Corporation, Armonk, N.Y.

[21] Appl. No.: 101,305

[22] Filed: Dec. 7, 1979

[51] Int. Cl.[3] .................. F27B 14/00; F27D 5/00
[52] U.S. Cl. .................. 432/13; 432/258; 432/265
[58] Field of Search ............... 432/13, 253, 258, 265

[56] References Cited

U.S. PATENT DOCUMENTS

| 3,553,800 | 1/1971 | Ploger et al. | 432/265 |
| 3,792,139 | 2/1974 | Weinstein | 264/58 |
| 3,992,139 | 11/1978 | Lovatt | 432/258 |
| 4,009,238 | 2/1977 | Niedermeier et al. | 264/61 |

OTHER PUBLICATIONS

IBM Technical Disclosure Bulletin, vol. 14, No. 10, Mar. 1972, "Porous Platens for Multilayer Ceramics Lamination," L. F. Muenkel.

IBM Technical Disclosure Bulletin, vol. 17, No. 2, Jul. 1974, "Making Green Sheet Ceramic Parts," F. M. Cullen.

Primary Examiner—John J. Camby
Attorney, Agent, or Firm—Wolmar J. Stoffel

[57] ABSTRACT

A method of achieving uniform shrinkage of a laminated green ceramic substrate during sintering wherein the substrate is placed on a flat, relatively thick plate of refractory material such as molybdenum, tantalum or tungsten or alloys thereof with the flat plate provided with a thin surface coating layer of a ceramic material, and heating the substrate to a sintering temperature and maintaining the temperature for a time sufficient to sinter the substrate.

A setter plate for supporting a planar green ceramic substrate during the sintering operation, the setter plate is made of a refractory material and provided with a thin ceramic coating at least on the top surface.

8 Claims, 5 Drawing Figures

METHOD OF ACHIEVING UNIFORM SINTERING SHRINKAGE IN A LAMINATED PLANAR GREEN CERAMIC SUBSTRATE AND APPARATUS THEREFOR

TECHNICAL FIELD

This invention relates to forming multilayer ceramic substrates for semiconductor packages, and more particularly to achieving a uniform shrinkage rate over the entire area of the substrate to thereby minimize distortion of the surface patterns and metallurgy.

During the sintering operation, the green ceramic substrate will shrink anywhere from 15% to 20%. This shrinkage must be uniform in a substrate for a device package containing very small metallurgy patterns that must match up with testing apparatus and ultimately the semiconductor devices to be mounted thereon.

BACKGROUND ART

Future semiconductor packages will be required to mount many highly integrated semiconductor devices, each with hundreds of circuits, on a single substrate, and interconnect these devices into an operative system. This will require that the area of the package be significantly increased, as compared to single device packages now in common usage, the wiring density increased, and that many closely spaced bonding terminals for connections to the semiconductor devices be provided. A structure that can potentially meet future high density package requirements is the multilayer ceramic substrate. In this substrate the metallurgy is buried within the substrate, making possible very complex and intricate wiring. This technology is well known and described in U.S. Pat. Nos. 3,540,894, 3,726,002, 3,770,529, 3,838,204, 3,852,877, 3,899,554, 4,109,377, and others. The basic process consists of forming a ceramic slurry of a particulate ceramic material, a resin binder, and a solvent for the binder, doctor blading the slurry and drying to produce ceramic green sheets, punching holes in and screening conductive lines on the green sheets, laminating the sheets, and sintering.

During the sintering step the substrate will shrink approximately 17% depending upon the materials, the sintering conditions, etc. This decrease in size can be accommodated by starting with a geometry that is larger than the final desired size by the amount of shrinkage. However, due to the relatively large size of the substrate, and the small geometry of the surface metallurgy, any variation of the shrinkage in the substrate presents serious problems in testing and in ultimately joining the devices to the substrate. If the shrinkage varies in different areas of the substrate, the substrate is frequently useless because of the resultant distortion.

Substrates are conventionally supported on a cured ceramic plate, typically $Al_2O_3$ plate during the sintering operation. This sintering procedure has not been satisfactory for achieving uniform shrinkage in all areas of the substrate during sintering.

DISCLOSURE OF INVENTION

An object of this invention is to provide a new method for minimizing sintering shrinkage distortion of a planar laminated multilayer ceramic substrate.

Another object of this invention is to provide a method for minimizing thermal gradients in a planar ceramic substrate during sintering.

Still another object of this invention is to provide a method of preventing bonding of a planar ceramic substrate to its support during a sintering operation.

Yet another object of this invention is to provide a new setter plate for supporting a laminated multilayer ceramic substrate during the sintering operation that minimizes shrinkage distortion.

Another object of this invention is to provide a new setter plate that minimizes thermal gradients within a ceramic substrate being sintered.

Another object of this invention is to provide a new setter plate that prevents bonding of the ceramic substrate being sintered to the plate.

In accordance with the method of the invention of achieving a uniform shrinkage of a laminated green ceramic substrate during sintering, the green substrate is placed on a flat, relatively thick plate of refractory metal selected from the group consisting of molybdenum, tungsten, tantalum and alloys thereof with the flat plate provided with a thin surface coating layer of a ceramic material, and subsequently heating the substrate to a sintering temperature and maintaining the temperature for a time sufficient to sinter the substrate.

In accordance with the present invention of a setter plate for supporting a planar green ceramic substrate during the sintering pattern wherein the plate minimizes shrinkage distortion, the flat plate consisting of a refractory metal selected from the group consisting of molybdenum, tantalum and tungsten, and high temperature alloys which include major proportions of the refractory metals, and a thin ceramic coating on at least the top surface of the flat plate.

BRIEF DESCRIPTION OF THE DRAWINGS

The details of my invention will be described in connection with the accompanying drawing wherein.

DESCRIPTION OF THE PREFERRED EMBODIMENT

Figure 1:
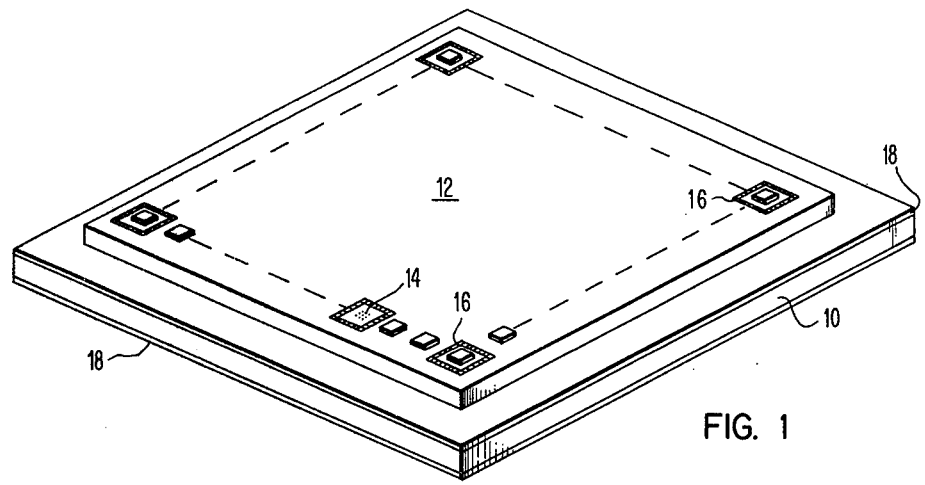
FIG. 1 is a prospective view illustrating a typical multilayer ceramic substrate positioned on a setter plate of the invention.

Referring now to the drawings, there is illustrated in FIG. 1 a setter plate 10 of the invention on which is supported a multilayer ceramic substrate 12. The substrate 12 is initially formed of a plurality of green ceramic sheets, each with via holes in a unique metallurgy pattern. The sheets are assembled to provide complex internal metallurgy circuits that interconnect devices which are subsequently joined to the device terminal pads. As illustrated, substrate 12 has a complex top surface metallurgy configuration which includes clusters of device terminal pads 14, which can be surrounded with one or more rows of engineering change pads 16. The completed sintered substrate will ordinarily be tested after sintering to check the integrity of the internal circuitry, have integrated circuit semiconductor devices joined to the terminal pads, and subsequently have engineering change wires bonded selectively to the engineering change pads. The testing, device joining and engineering change wire bonding will ordinarily be accomplished with highly automated apparatus. It is of utmost importance that all of the pads in the surface metallurgy configuration be located in relatively predictable locations. This requires that the shrinkage of the substrate 12 be uniform during the sintering operation, where the average shrinkage rate can vary from 17 to 20%. The setter plate 10 of the invention is formed of a refractory metal such as molybdenum, tantalum, or tungsten, or alloys which include major proportions of refractory metals. An example of a suitable alloy suitable for use in the setter plate of the invention is known as TZM, which is a molybdenum alloy with a composition of 99.42% molybdenum, 0.5% tantalum, and 0.08% zirconium. Plate 10 can be of any suitable thickness necessary to support the substrate being sintered in the high temperature environment of a sintering furnace. In general the ratio of the length or width to the thickness is in the range of 40 to 1. Setter plate 10 has a thin ceramic coating 18 on at least the top surface. The coating can be provided on the bottom surface and edges as well, if desired. Coating 18 prevents bonding of the ceramic substrate being sintered to the plate, and also resists wear. Any suitable ceramic material can be used which will withstand the high sintering temperature without contaminating the substrate. A preferred coating material is $Al_2O_3$ which is plasma sprayed to a thickness in the range of 0.05 mm to 0.25 mm, more preferably in the range of 0.08 mm to 0.125 mm. The surface finish of the ceramic coating 18 is in the range of 3 to 6 micro meters, more preferably from 3 to 5 micro meters.

During the sintering operation, the multilayer ceramic substrate 12 rests on setter plate 10, free of restraint. During sintering the substrate shrinks from 15 to 20% and must be free to shift on its support to accommodate this shrinkage. The surface finish of the coating 18 is very important in that it must be sufficiently rough to prevent the substrate from sticking to the plate, and also be sufficiently smooth to allow limited movement of portions of the substrate. Any restraint of the substrate will result in distortion of the final ceramic substrate, which is unacceptable. Another requirement is that the substrate temperature be maintained as uniform as possible. The thermal conductivity of the refractory setter tile of the invention is from 5 to 20 times that of the conventional $Al_2O_3$ in the temperature range of 1250° C. to 1650° C., the critical range in which the substrate densifies. The setter tile of the invention thus maintains a uniform substrate temperature. Flatness is also a rigouous requirement for sintering multilayer ceramic substrates. Because the substrate usually conforms to the surface on which it is sintered, it is necessary that the supporting plate remain flat and rigid at temperatures of 1550° C. to 1650° C. which is a common sintering temperature range. Molybdenum and the other mentioned refractory metals meets this requirement using thicknesses from 2 to 3 times less than those of tiles of ceramic formulations. This results in increased throughput, since more of the kiln area can be used for product and less for carriers.

Figure 3:
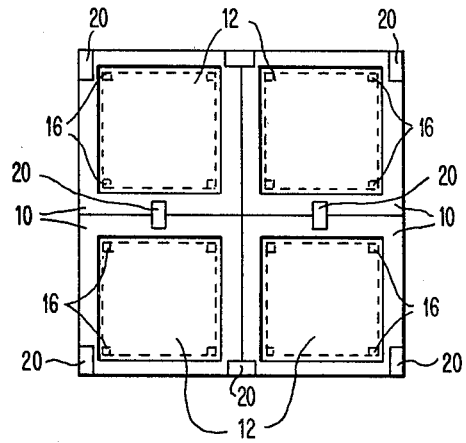
FIG. 3 is a top plan view of the stack of setter plates and substrates shown in FIG. 2.
Figure 2:
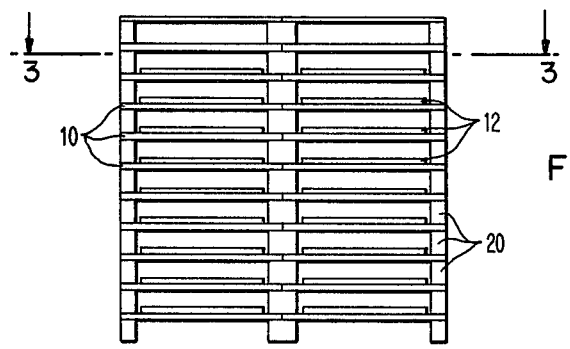
FIG. 2 is a side elevational view of a stack of setter tiles of the invention supporting a ceramic substrate in preparation for a sintering operation.

Referring now to FIGS. 2 and 3 of the drawings, there is illustrated a typical arrangement of setter tiles, substrates, and spacer blocks for sintering. Tiles 10 are supported on $Al_2O_3$ spacer blocks 20 which are arranged in tiers. A multilayer ceramic substrate 12 rests free of restraint on each tile 10. FIG. 3 illustrates the placement of the spacer blocks and substrates 12 relative to tiles 10. The arrangement illustrated is a typical one and obviously other satisfactory arrangements of the tiles and blocks can be made.

The following example is included to portray a preferred embodiment of the invention and is not intended to unduly limit the scope of the claims defining the invention.

EXAMPLE

In order to test and also compare the effectiveness of the setter tile of the invention with conventional ceramic setter tile during a sintering operation, 40 dummy multilayer ceramic substrates were prepared. The substrates were prepared by doctor blading and drying a ceramic slurry containing particulate material of 89% $Al_2O_3$, 11% glass frit, a polyvinylbutyral resin, a solvent for the resin, and a plasticizer. Each substrate was formed of 28 green ceramic sheets with an overall thickness of 5.6 mm. The thickness of a single sheet was 0.2 mm. In order to eliminate any distortion contribution from internal metallurgy, the inner ceramic sheets were blank, i.e., no vias or printed lines. However, the outer sheets contained metal filled vias and pads suitable for making connections to semiconductor devices and engineering change pads on the top surface, and I/O pins on the bottom surface. The multilayer ceramic substrates each measured 109 mm by 109 mm. The top surface metallurgy included 100 fiducial marks arranged in a rectangular grid.

Twenty of the substrates were placed on setter tiles of the invention and the tiles arranged in stacks as illustrated in FIGS. 2 and 3. The setter tiles were formed of molybdenum with a thickness of 6.35 mm. The tiles measured 140 mm×140 mm. The surfaces of the tiles were ground flat (25 um TIR), and coated with 125 um thick layer of plasma flame-sprayed alumina with a surface finish of 5 u.m. CLA.

The remaining 20 multilayer ceramic substrates were placed on ground alumina setter tiles which were also arranged in stacks as shown in FIGS. 2 and 3. The alumina setter tiles were of the same dimensions as the tiles of the invention except that the thickness was greater which is necessitated by the decrease strength during the sintering operation.

Figure 4:
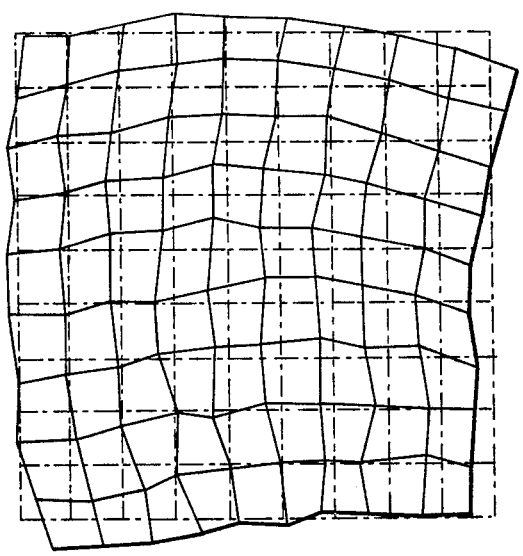
FIG. 4 is a distortion map of a sintered substrate which has been sintered on a conventional $Al_2O_3$ plate which illustrates graphically the distortion produced in the substrate.
Figure 5:
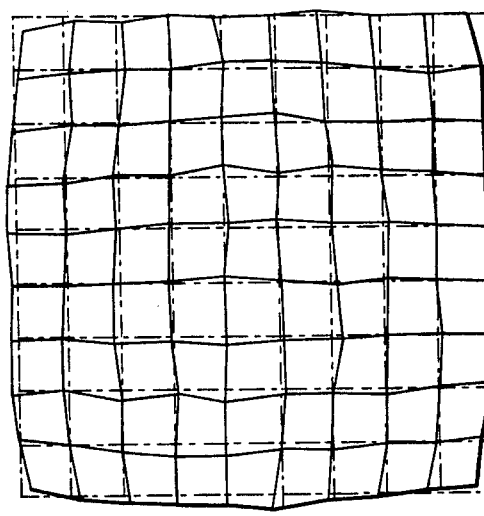
FIG. 5 is a top plan view of a map of a ceramic substrate which has been sintered on the setter plate of the invention which illustrates the distortion obtained thereon for comparison with FIG. 4.

The substrates supported on the respective setter tiles were introduced into a sintering furnace and exposed to a sintering cycle when the temperature was increased for 15 hours until it reached a temperature of 1560° C., and held at the temperature for 3 hours. The furnace was allowed to cool down to about 100° C. over a period of 16 hours. During the sintering cycle, hydrogen was introduced and maintained in the furnace. Upon removal of the sintered ceramic substrates from the furnace, it was determined that the shrinkage was 17%. The location of each fidicial mark was carefully measured and a distortion map made for each substrate from the resultant data. The distortion map consisted of a first grid of dotted lines resulting from calculating the theoretical location of each of the fiducial marks and drawing X and Y lines through the points. A second grid was drawn of the map in solid lines illustrating the distortion. The actual variations of the location of the ficicial marks from the calculated theoretical locations were multiplied by a factor of 100 and placed on the map. The points were then connected with solid lines. Typical distortion maps from each of the substrates are illustrated in FIGS. 4 and 5 of the drawing. Note that FIG. 4, which depicts a distortion map of a ceramic substrate supported on an Al$_2$O$_3$ tile shows significantly more distortion than a substrate supported on the setter tile of the invention as depicted in FIG. 5. This clearly illustrates the superior operating characteristics of the setter tile of the invention in reducing distortion during the sintering operation. The reduction in distortion when using the tile of the invention is believed to result from improved thermal conductivity of the molybdenum metal, and also the surface interface with the tile produced by the plasma flame-sprayed alumina.

I claim:

1. A method of achieving uniform shrinkage of a green ceramic substrate during sintering comprising
  providing a flat, relatively thick plate of a refractory metal selected from the group consisting of Mo, W and Ta, and alloys thereof, said plate having a thin surface coating layer of ceramic material on at least the top surface thereof,
  placing the ceramic substrate to be sintered on the said plate of a refractory metal in contact with said surface coating of ceramic material, and
  heating the substrate to a sintering temperature and maintaining the temperature for a time sufficient to sinter the substrate.

2. The method of claim 1 wherein said sintering temperature is in the range of 1250° to 1650° C.

3. The method of claim 1 wherein said thin surface coating layer is Al$_2$O$_3$ with a thickness in the range of 0.08 to 0.125 mm.

4. The method of claim 3 wherein said coating layer has a surface roughness in the range of 3 to 6 mm.

5. A setter plate for supporting a planar green ceramic substrate during a sintering operation, which plate minimizes shrinkage distortion comprising
  a flat plate of refractory metal selected from the group consisting of Mo, Ta, W and high temperature alloys which include major proportions of refractory metals,
  a thin ceramic coating on at least the top work supporting surface of said flat plate for supporting a ceramic substrate during a sintering operation.

6. The setter plate of claim 5 wherein said ceramic layer has a surface roughness in the range of 3 to 6 mm.

7. The setter plate of claim 6 wherein said ceramic layer is Al$_2$O$_3$.

8. The setter plate of claim 6 wherein the thickness of said ceramic layer is in the range of 0.08 to 0.125 mm.

* * * * *